(12) United States Patent
Ellis et al.

(10) Patent No.: US 9,549,457 B2
(45) Date of Patent: Jan. 17, 2017

(54) SYSTEM AND METHOD FOR REDIRECTING AIRFLOW ACROSS AN ELECTRONIC ASSEMBLY

(71) Applicant: SanDisk Enterprise IP LLC, Milpitas, CA (US)

(72) Inventors: Robert W. Ellis, Phoenix, AZ (US); David Dean, Litchfield Park, AZ (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 86 days.

(21) Appl. No.: 14/179,247

(22) Filed: Feb. 12, 2014

(65) Prior Publication Data

US 2015/0230327 A1 Aug. 13, 2015

(51) Int. Cl.
| | |
|---|---|
| H05K 7/20 | (2006.01) |
| H05K 1/02 | (2006.01) |
| H05K 9/00 | (2006.01) |
| G06F 1/20 | (2006.01) |
| H01L 23/467 | (2006.01) |
| H05K 1/18 | (2006.01) |

(52) U.S. Cl.
CPC .............. *H05K 1/0203* (2013.01); *G06F 1/20* (2013.01); *H01L 23/467* (2013.01); *H05K 1/0209* (2013.01); *H05K 1/189* (2013.01); *H05K 7/20127* (2013.01); *H05K 7/20145* (2013.01); *H05K 9/0079* (2013.01); *H01L 2924/0002* (2013.01); *H05K 2201/09063* (2013.01)

(58) Field of Classification Search
None
See application file for complete search history.

(56) References Cited

U.S. PATENT DOCUMENTS

| | | |
|---|---|---|
| 4,519,016 A | 5/1985 | Bradley et al. |
| 4,839,587 A | 6/1989 | Flatley et al. |
| 4,916,652 A | 4/1990 | Schwarz et al. |
| 5,210,680 A | 5/1993 | Scheibler |
| 5,270,979 A | 12/1993 | Harari et al. |
| 5,489,805 A | 2/1996 | Hackitt et al. |
| 5,519,847 A | 5/1996 | Fandrich et al. |

(Continued)

FOREIGN PATENT DOCUMENTS

| | | |
|---|---|---|
| CN | 201 655 782 | 11/2010 |
| CN | 102 446 873 | 5/2012 |

(Continued)

OTHER PUBLICATIONS

Invitation to Pay Additional Fees dated Jul. 25, 2014, received in International Patent Application No. PCT/US2014/021290, which corresponds to U.S. Appl. No. 13/791,797, 8 pages (Dean).

(Continued)

*Primary Examiner* — Courtney Smith
(74) *Attorney, Agent, or Firm* — Morgan, Lewis & Bockius LLP

(57) ABSTRACT

The system for redirecting airflow includes multiple electronic assemblies arranged adjacent to one another. Each electronic assembly includes a substrate having a substantially flat first surface and an opposing substantially flat second surface. Electronic devices are coupled to each of the first and second surfaces. Each surface also has one or more tabs coupled thereto, where each tab is configured to redirect the airflow over a least one electronic device.

22 Claims, 12 Drawing Sheets

(56) References Cited

U.S. PATENT DOCUMENTS

| | | | |
|---|---|---|---|
| 5,530,705 A | 6/1996 | Malone, Sr. | |
| 5,537,555 A | 7/1996 | Landry et al. | |
| 5,551,003 A | 8/1996 | Mattson et al. | |
| 5,628,031 A | 5/1997 | Kikinis et al. | |
| 5,657,332 A | 8/1997 | Auclair et al. | |
| 5,666,114 A | 9/1997 | Brodie et al. | |
| 5,705,850 A | 1/1998 | Ashiwake et al. | |
| 5,708,849 A | 1/1998 | Coke et al. | |
| 5,763,950 A * | 6/1998 | Fujisaki | H01L 23/3672 165/80.3 |
| 5,828,549 A | 10/1998 | Gandre et al. | |
| 5,923,532 A | 7/1999 | Nedved | |
| 5,943,692 A | 8/1999 | Marberg et al. | |
| 5,946,190 A | 8/1999 | Patel et al. | |
| 5,973,920 A | 10/1999 | Altic et al. | |
| 5,982,664 A | 11/1999 | Watanabe | |
| 6,000,006 A | 12/1999 | Bruce et al. | |
| 6,008,987 A | 12/1999 | Gale et al. | |
| 6,009,938 A | 1/2000 | Smith et al. | |
| 6,016,560 A | 1/2000 | Wada et al. | |
| 6,018,304 A | 1/2000 | Bessios | |
| 6,031,730 A | 2/2000 | Kroske | |
| 6,058,012 A | 5/2000 | Cooper et al. | |
| 6,061,245 A | 5/2000 | Ingraham et al. | |
| 6,070,074 A | 5/2000 | Perahia et al. | |
| 6,084,773 A | 7/2000 | Nelson et al. | |
| 6,138,261 A | 10/2000 | Wilcoxson et al. | |
| 6,182,264 B1 | 1/2001 | Ott | |
| 6,192,092 B1 | 2/2001 | Dizon et al. | |
| 6,295,592 B1 | 9/2001 | Jeddeloh | |
| 6,311,263 B1 | 10/2001 | Barlow et al. | |
| 6,335,862 B1 | 1/2002 | Koya | |
| 6,411,511 B1 | 6/2002 | Chen | |
| 6,442,076 B1 | 8/2002 | Roohparvar | |
| 6,449,625 B1 | 9/2002 | Wang | |
| 6,484,224 B1 | 11/2002 | Robins et al. | |
| 6,507,101 B1 | 1/2003 | Morris | |
| 6,516,437 B1 | 2/2003 | Van Stralen et al. | |
| 6,528,878 B1 | 3/2003 | Daikoku et al. | |
| 6,541,310 B1 | 4/2003 | Lo et al. | |
| 6,570,762 B2 | 5/2003 | Cross et al. | |
| 6,618,249 B2 | 9/2003 | Fairchild | |
| 6,621,705 B1 | 9/2003 | Ballenger et al. | |
| 6,678,788 B1 | 1/2004 | O'Connell | |
| 6,757,768 B1 | 6/2004 | Potter et al. | |
| 6,762,942 B1 | 7/2004 | Smith | |
| 6,775,792 B2 | 8/2004 | Ulrich et al. | |
| 6,810,440 B2 | 10/2004 | Micalizzi, Jr. et al. | |
| 6,836,808 B2 | 12/2004 | Bunce et al. | |
| 6,836,815 B1 | 12/2004 | Purcell et al. | |
| 6,842,436 B2 | 1/2005 | Moeller | |
| 6,871,257 B2 | 3/2005 | Conley et al. | |
| 6,892,801 B1 | 5/2005 | Kim | |
| 6,895,464 B2 | 5/2005 | Chow et al. | |
| 6,934,152 B1 | 8/2005 | Barrow | |
| 6,978,343 B1 | 12/2005 | Ichiriu | |
| 6,980,985 B1 | 12/2005 | Amer-Yahia et al. | |
| 6,981,205 B2 | 12/2005 | Fukushima et al. | |
| 6,988,171 B2 | 1/2006 | Beardsley et al. | |
| 6,997,720 B2 | 2/2006 | Perret et al. | |
| 7,020,017 B2 | 3/2006 | Chen et al. | |
| 7,030,482 B2 | 4/2006 | Haines | |
| 7,032,123 B2 | 4/2006 | Kane et al. | |
| 7,043,505 B1 | 5/2006 | Teague et al. | |
| 7,075,788 B2 | 7/2006 | Larson et al. | |
| 7,079,972 B1 | 7/2006 | Wood et al. | |
| 7,100,002 B2 | 8/2006 | Shrader | |
| 7,111,293 B1 | 9/2006 | Hersh et al. | |
| 7,162,678 B2 | 1/2007 | Saliba | |
| 7,173,852 B2 | 2/2007 | Gorobets et al. | |
| 7,184,446 B2 | 2/2007 | Rashid et al. | |
| 7,233,501 B1 | 6/2007 | Ingalz | |
| 7,280,364 B2 | 10/2007 | Harris et al. | |
| 7,328,377 B1 | 2/2008 | Lewis et al. | |
| 7,474,528 B1 * | 1/2009 | Olesiewicz | H05K 7/20154 361/694 |
| 7,480,147 B2 | 1/2009 | Hoss et al. | |
| 7,516,292 B2 | 4/2009 | Kimura et al. | |
| 7,523,157 B2 | 4/2009 | Aguilar, Jr. et al. | |
| 7,527,466 B2 | 5/2009 | Simmons | |
| 7,529,466 B2 | 5/2009 | Takahashi | |
| 7,571,277 B2 | 8/2009 | Mizushima | |
| 7,574,554 B2 | 8/2009 | Tanaka et al. | |
| 7,595,994 B1 | 9/2009 | Sun | |
| 7,596,643 B2 | 9/2009 | Merry, Jr. et al. | |
| 7,599,182 B2 * | 10/2009 | Sun | H01L 23/4006 165/80.3 |
| 7,623,343 B2 | 11/2009 | Chen | |
| 7,681,106 B2 | 3/2010 | Jarrar et al. | |
| 7,685,494 B1 | 3/2010 | Varnica et al. | |
| 7,707,481 B2 | 4/2010 | Kirschner et al. | |
| 7,761,655 B2 | 7/2010 | Mizushima et al. | |
| 7,774,390 B2 | 8/2010 | Shin | |
| 7,840,762 B2 | 11/2010 | Oh et al. | |
| 7,870,326 B2 | 1/2011 | Shin et al. | |
| 7,890,818 B2 | 2/2011 | Kong et al. | |
| 7,913,022 B1 | 3/2011 | Baxter | |
| 7,925,960 B2 | 4/2011 | Ho et al. | |
| 7,934,052 B2 | 4/2011 | Prins et al. | |
| 7,954,041 B2 | 5/2011 | Hong et al. | |
| 7,959,445 B1 | 6/2011 | Daily et al. | |
| 7,961,462 B2 * | 6/2011 | Hernon | H05K 7/20145 165/109.1 |
| 7,971,112 B2 | 6/2011 | Murata | |
| 7,974,368 B2 | 7/2011 | Shieh et al. | |
| 7,978,516 B2 | 7/2011 | Olbrich et al. | |
| 7,980,863 B1 | 7/2011 | Holec et al. | |
| 7,989,709 B2 | 8/2011 | Tsao | |
| 7,996,642 B1 | 8/2011 | Smith | |
| 8,000,096 B2 | 8/2011 | Nemoz et al. | |
| 8,006,161 B2 | 8/2011 | Lestable et al. | |
| 8,032,724 B1 | 10/2011 | Smith | |
| 8,069,390 B2 | 11/2011 | Lin | |
| 8,190,967 B2 | 5/2012 | Hong et al. | |
| 8,198,539 B2 | 6/2012 | Otoshi et al. | |
| 8,208,252 B2 | 6/2012 | Tolliver | |
| 8,254,181 B2 | 8/2012 | Hwang et al. | |
| 8,305,103 B2 | 11/2012 | Kang et al. | |
| 8,312,349 B2 | 11/2012 | Reche et al. | |
| 8,373,986 B2 * | 2/2013 | Sun | G06F 1/20 165/104.33 |
| 8,405,985 B1 | 3/2013 | Reynov et al. | |
| 8,412,985 B1 | 4/2013 | Bowers et al. | |
| 8,472,183 B1 | 6/2013 | Ross et al. | |
| 8,477,495 B2 * | 7/2013 | Sun | H05K 7/20145 361/679.47 |
| 8,570,740 B2 * | 10/2013 | Cong | G06F 1/20 361/679.49 |
| 8,599,560 B2 | 12/2013 | Wu et al. | |
| 9,089,073 B2 | 7/2015 | Reynov et al. | |
| 2002/0008963 A1 | 1/2002 | DiBene, II et al. | |
| 2002/0024846 A1 | 2/2002 | Kawahara et al. | |
| 2002/0076951 A1 | 6/2002 | Roy | |
| 2002/0083299 A1 | 6/2002 | Van Huben et al. | |
| 2002/0123259 A1 | 9/2002 | Yatskov et al. | |
| 2002/0152305 A1 | 10/2002 | Jackson et al. | |
| 2002/0162039 A1 | 10/2002 | Kirker et al. | |
| 2002/0162075 A1 | 10/2002 | Talagala et al. | |
| 2002/0165896 A1 | 11/2002 | Kim | |
| 2003/0041299 A1 | 2/2003 | Kanazawa et al. | |
| 2003/0043829 A1 | 3/2003 | Rashid et al. | |
| 2003/0088805 A1 | 5/2003 | Majni et al. | |
| 2003/0093628 A1 | 5/2003 | Matter et al. | |
| 2003/0184970 A1 | 10/2003 | Bosch et al. | |
| 2003/0188045 A1 | 10/2003 | Jacobson | |
| 2003/0189856 A1 | 10/2003 | Cho et al. | |
| 2003/0198100 A1 | 10/2003 | Matsushita et al. | |
| 2003/0212719 A1 | 11/2003 | Yasuda et al. | |
| 2004/0024957 A1 | 2/2004 | Lin et al. | |
| 2004/0024963 A1 | 2/2004 | Talagala et al. | |
| 2004/0073829 A1 | 4/2004 | Olarig | |
| 2004/0153902 A1 | 8/2004 | Machado et al. | |
| 2004/0181734 A1 | 9/2004 | Saliba | |

(56) References Cited

U.S. PATENT DOCUMENTS

| | | |
|---|---|---|
| 2004/0199714 A1 | 10/2004 | Estakhri et al. |
| 2004/0218367 A1 | 11/2004 | Lin et al. |
| 2004/0237018 A1 | 11/2004 | Riley |
| 2004/0246662 A1 | 12/2004 | Thurk et al. |
| 2005/0009382 A1 | 1/2005 | Burmeister et al. |
| 2005/0013120 A1 | 1/2005 | Liu |
| 2005/0060456 A1 | 3/2005 | Shrader et al. |
| 2005/0060501 A1 | 3/2005 | Shrader |
| 2005/0082663 A1 | 4/2005 | Wakiyama et al. |
| 2005/0114587 A1 | 5/2005 | Chou et al. |
| 2005/0152112 A1 | 7/2005 | Holmes et al. |
| 2005/0172065 A1 | 8/2005 | Keays |
| 2005/0172207 A1 | 8/2005 | Radke et al. |
| 2005/0193161 A1 | 9/2005 | Lee et al. |
| 2005/0201148 A1 | 9/2005 | Chen et al. |
| 2005/0231765 A1 | 10/2005 | So et al. |
| 2005/0257120 A1 | 11/2005 | Gorobets et al. |
| 2005/0273560 A1 | 12/2005 | Hulbert et al. |
| 2005/0289314 A1 | 12/2005 | Adusumilli et al. |
| 2006/0039196 A1 | 2/2006 | Gorobets et al. |
| 2006/0042291 A1* | 3/2006 | Petroski ............... G06F 1/20 62/264 |
| 2006/0053246 A1 | 3/2006 | Lee |
| 2006/0067066 A1 | 3/2006 | Meier et al. |
| 2006/0085671 A1 | 4/2006 | Majni et al. |
| 2006/0133041 A1 | 6/2006 | Belady et al. |
| 2006/0136570 A1 | 6/2006 | Pandya |
| 2006/0156177 A1 | 7/2006 | Kottapalli et al. |
| 2006/0195650 A1 | 8/2006 | Su et al. |
| 2006/0259528 A1 | 11/2006 | Dussud et al. |
| 2007/0001282 A1 | 1/2007 | Kang et al. |
| 2007/0011413 A1 | 1/2007 | Nonaka et al. |
| 2007/0057686 A1 | 3/2007 | Suga et al. |
| 2007/0058446 A1 | 3/2007 | Hwang et al. |
| 2007/0061597 A1 | 3/2007 | Holtzman et al. |
| 2007/0074850 A1 | 4/2007 | Peschl |
| 2007/0076479 A1 | 4/2007 | Kim et al. |
| 2007/0081408 A1 | 4/2007 | Kwon et al. |
| 2007/0083697 A1 | 4/2007 | Birrell et al. |
| 2007/0091677 A1 | 4/2007 | Lasser et al. |
| 2007/0097653 A1 | 5/2007 | Gilliland et al. |
| 2007/0113019 A1 | 5/2007 | Beukema et al. |
| 2007/0121297 A1 | 5/2007 | Uchizono et al. |
| 2007/0133312 A1 | 6/2007 | Roohparvar |
| 2007/0145996 A1 | 6/2007 | Shiao et al. |
| 2007/0147113 A1 | 6/2007 | Mokhlesi et al. |
| 2007/0150790 A1 | 6/2007 | Gross et al. |
| 2007/0157064 A1 | 7/2007 | Falik et al. |
| 2007/0174579 A1 | 7/2007 | Shin |
| 2007/0180188 A1 | 8/2007 | Fujibayashi et al. |
| 2007/0201274 A1 | 8/2007 | Yu et al. |
| 2007/0208901 A1 | 9/2007 | Purcell et al. |
| 2007/0211426 A1 | 9/2007 | Clayton et al. |
| 2007/0211436 A1 | 9/2007 | Robinson et al. |
| 2007/0216005 A1 | 9/2007 | Yim et al. |
| 2007/0216009 A1 | 9/2007 | Ng |
| 2007/0230111 A1 | 10/2007 | Starr et al. |
| 2007/0234143 A1 | 10/2007 | Kim |
| 2007/0245061 A1 | 10/2007 | Harriman |
| 2007/0246189 A1 | 10/2007 | Lin et al. |
| 2007/0247805 A1 | 10/2007 | Fujie et al. |
| 2007/0277036 A1 | 11/2007 | Chamberlain et al. |
| 2007/0291556 A1 | 12/2007 | Kamei |
| 2007/0294496 A1 | 12/2007 | Goss et al. |
| 2007/0300130 A1 | 12/2007 | Gorobets |
| 2008/0019095 A1 | 1/2008 | Liu |
| 2008/0019182 A1 | 1/2008 | Yanagidaira et al. |
| 2008/0022163 A1 | 1/2008 | Tanaka et al. |
| 2008/0026637 A1 | 1/2008 | Minich |
| 2008/0043435 A1 | 2/2008 | Yip et al. |
| 2008/0052435 A1 | 2/2008 | Norwood et al. |
| 2008/0052446 A1 | 2/2008 | Lasser et al. |
| 2008/0056005 A1 | 3/2008 | Aritome |
| 2008/0068796 A1* | 3/2008 | Pav ..................... G06F 1/206 361/695 |
| 2008/0077841 A1 | 3/2008 | Gonzalez et al. |
| 2008/0077937 A1 | 3/2008 | Shin et al. |
| 2008/0086677 A1 | 4/2008 | Yang et al. |
| 2008/0116571 A1* | 5/2008 | Dang ................ H01L 23/3672 257/721 |
| 2008/0144371 A1 | 6/2008 | Yeh et al. |
| 2008/0147964 A1 | 6/2008 | Chow et al. |
| 2008/0147998 A1 | 6/2008 | Jeong |
| 2008/0148124 A1 | 6/2008 | Zhang et al. |
| 2008/0158818 A1 | 7/2008 | Clidaras et al. |
| 2008/0163030 A1 | 7/2008 | Lee |
| 2008/0168191 A1 | 7/2008 | Biran et al. |
| 2008/0168319 A1 | 7/2008 | Lee et al. |
| 2008/0170460 A1 | 7/2008 | Oh et al. |
| 2008/0229000 A1 | 9/2008 | Kim |
| 2008/0229003 A1 | 9/2008 | Mizushima et al. |
| 2008/0229176 A1 | 9/2008 | Arnez et al. |
| 2008/0236791 A1 | 10/2008 | Wayman |
| 2008/0252324 A1 | 10/2008 | Barabi et al. |
| 2008/0254573 A1 | 10/2008 | Sir et al. |
| 2008/0266807 A1 | 10/2008 | Lakin et al. |
| 2008/0270680 A1 | 10/2008 | Chang |
| 2008/0282128 A1 | 11/2008 | Lee et al. |
| 2008/0285351 A1 | 11/2008 | Shlick et al. |
| 2008/0291636 A1 | 11/2008 | Mori et al. |
| 2009/0003058 A1 | 1/2009 | Kang |
| 2009/0037652 A1 | 2/2009 | Yu et al. |
| 2009/0144598 A1 | 6/2009 | Yoon et al. |
| 2009/0168525 A1 | 7/2009 | Olbrich et al. |
| 2009/0172258 A1 | 7/2009 | Olbrich et al. |
| 2009/0172259 A1 | 7/2009 | Prins et al. |
| 2009/0172260 A1 | 7/2009 | Olbrich et al. |
| 2009/0172261 A1 | 7/2009 | Prins et al. |
| 2009/0172262 A1 | 7/2009 | Olbrich et al. |
| 2009/0172308 A1 | 7/2009 | Prins et al. |
| 2009/0172335 A1 | 7/2009 | Kulkarni et al. |
| 2009/0172499 A1 | 7/2009 | Olbrich et al. |
| 2009/0190308 A1* | 7/2009 | Bhattacharya ........... G06F 1/20 361/694 |
| 2009/0193058 A1 | 7/2009 | Reid |
| 2009/0207660 A1 | 8/2009 | Hwang et al. |
| 2009/0222708 A1 | 9/2009 | Yamaga |
| 2009/0228761 A1 | 9/2009 | Perlmutter et al. |
| 2009/0273898 A1 | 11/2009 | Imsand |
| 2009/0292972 A1 | 11/2009 | Seol et al. |
| 2009/0296466 A1 | 12/2009 | Kim et al. |
| 2009/0296486 A1 | 12/2009 | Kim et al. |
| 2009/0302458 A1 | 12/2009 | Kubo et al. |
| 2009/0309214 A1 | 12/2009 | Szewerenko et al. |
| 2009/0319864 A1 | 12/2009 | Shrader |
| 2010/0008034 A1 | 1/2010 | Hinkle |
| 2010/0061151 A1 | 3/2010 | Miwa et al. |
| 2010/0073860 A1 | 3/2010 | Moriai et al. |
| 2010/0073880 A1 | 3/2010 | Liu |
| 2010/0091463 A1 | 4/2010 | Buresch et al. |
| 2010/0103737 A1 | 4/2010 | Park |
| 2010/0118496 A1 | 5/2010 | Lo |
| 2010/0161936 A1 | 6/2010 | Royer et al. |
| 2010/0164525 A1 | 7/2010 | Han et al. |
| 2010/0199125 A1 | 8/2010 | Reche |
| 2010/0202196 A1 | 8/2010 | Lee et al. |
| 2010/0208521 A1 | 8/2010 | Kim et al. |
| 2010/0224985 A1 | 9/2010 | Michael et al. |
| 2010/0262889 A1 | 10/2010 | Bains |
| 2010/0281207 A1 | 11/2010 | Miller et al. |
| 2010/0281342 A1 | 11/2010 | Chang et al. |
| 2010/0296255 A1 | 11/2010 | Maloney |
| 2010/0319986 A1 | 12/2010 | Bleau et al. |
| 2010/0328887 A1 | 12/2010 | Refai-Ahmed et al. |
| 2011/0051513 A1 | 3/2011 | Shen et al. |
| 2011/0083060 A1 | 4/2011 | Sakurada et al. |
| 2011/0113281 A1 | 5/2011 | Zhang et al. |
| 2011/0131444 A1 | 6/2011 | Buch et al. |
| 2011/0132000 A1 | 6/2011 | Deane et al. |
| 2011/0173378 A1 | 7/2011 | Filor et al. |
| 2011/0182035 A1 | 7/2011 | Yajima |
| 2011/0188205 A1 | 8/2011 | MacManus et al. |
| 2011/0205823 A1 | 8/2011 | Hemink et al. |
| 2011/0213920 A1 | 9/2011 | Frost et al. |

(56) References Cited

U.S. PATENT DOCUMENTS

| | | |
|---|---|---|
| 2011/0228601 A1 | 9/2011 | Olbrich et al. |
| 2011/0231600 A1 | 9/2011 | Tanaka et al. |
| 2011/0299244 A1 | 12/2011 | Dede et al. |
| 2011/0317359 A1 | 12/2011 | Wei et al. |
| 2012/0014067 A1 | 1/2012 | Siracki |
| 2012/0064781 A1 | 3/2012 | Krishnan et al. |
| 2012/0096217 A1 | 4/2012 | Son et al. |
| 2012/0110250 A1 | 5/2012 | Sabbag et al. |
| 2012/0151253 A1 | 6/2012 | Horn |
| 2012/0151294 A1 | 6/2012 | Yoo et al. |
| 2012/0170224 A1 | 7/2012 | Fowler et al. |
| 2012/0195126 A1 | 8/2012 | Roohparvar |
| 2012/0201007 A1 | 8/2012 | Yeh et al. |
| 2012/0239976 A1 | 9/2012 | Cometti et al. |
| 2012/0284587 A1 | 11/2012 | Yu et al. |
| 2012/0293962 A1 | 11/2012 | McCluskey et al. |
| 2012/0327598 A1 | 12/2012 | Nakayama |
| 2013/0155800 A1 | 6/2013 | Shim et al. |
| 2013/0181733 A1 | 7/2013 | Kikuchi et al. |
| 2013/0285686 A1 | 10/2013 | Malik et al. |
| 2013/0294028 A1 | 11/2013 | Lafont et al. |
| 2013/0307060 A1 | 11/2013 | Wang et al. |
| 2014/0055944 A1 | 2/2014 | McCabe et al. |
| 2014/0071614 A1 | 3/2014 | Kaldani |
| 2014/0136927 A1 | 5/2014 | Li et al. |
| 2014/0153181 A1 | 6/2014 | Peng et al. |
| 2014/0182814 A1 | 7/2014 | Lin |

FOREIGN PATENT DOCUMENTS

| | | |
|---|---|---|
| DE | 199 10 500 A1 | 10/2000 |
| DE | 2005 063281 | 7/2007 |
| EP | 0 600 590 A1 | 6/1994 |
| EP | 0 989 794 A2 | 3/2000 |
| EP | 1465203 A1 | 10/2004 |
| EP | 1 990 921 A2 | 11/2008 |
| EP | 2 066 158 A2 | 6/2009 |
| EP | 2 395 827 A2 | 12/2011 |
| EP | 2 600 700 A1 | 6/2013 |
| FR | 2560731 | 9/1985 |
| JP | 06006064 | 1/1994 |
| JP | 2002-532806 S | 10/2002 |
| JP | 2003 188565 | 7/2003 |
| WO | WO 88 07193 | 3/1988 |
| WO | WO 03/094586 A1 | 11/2003 |
| WO | WO 2004/086827 A2 | 10/2004 |
| WO | WO 2007/036834 A2 | 4/2007 |
| WO | WO 2007/080586 A2 | 7/2007 |
| WO | WO 2008/013850 A2 | 1/2008 |
| WO | WO 2008/121553 A1 | 10/2008 |
| WO | WO 2008/121577 A1 | 10/2008 |
| WO | WO 2009/028281 A1 | 3/2009 |
| WO | WO 2009/032945 A1 | 3/2009 |
| WO | WO 2009/058140 A1 | 5/2009 |
| WO | WO 2009/084724 | 7/2009 |
| WO | WO 2009/134576 A1 | 11/2009 |
| WO | WO 2011/024015 | 3/2011 |
| WO | WO 2013/080341 | 5/2013 |
| WO | WO 2013/080341 | 6/2013 |

OTHER PUBLICATIONS

International Search Report and Written Opinion dated Sep. 12, 2014, received in International Patent Application No. PCT/US2014/043146.

International Search Report and Written Opinion dated Dec. 16, 2014, received in International Patent Application No. PCT/US2014/059114, which corresponds to U.S. Appl. No. 14/135,223, 9 pages (Dean).

International Search Report and Written Opinion dated Nov. 20, 2014, received in International Patent Application No. PCT/US2014/020290, which corresponds to U.S. Appl. No. 13/791,797, 21 pages (Dean).

International Search Report and Written Opinion dated Dec. 23, 2014, received in International Patent Application No. PCT/US2014/042772, which corresponds to U.S. Appl. No. 13/922,105, 10 pages (Dean).

International Search Report and Written Opinion dated Apr. 28, 2015 received in International Patent Application No. PCT/US2015/014563, which corresponds to U.S. Appl. No. 14/179,247, 9 pages (Ellis).

International Search Report and Written Opinion dated May 8, 2015, received in International Patent Application No. PCT/US2015/017722, which corresponds to U.S. Appl. No. 14/277,716, 9 pages (Dean).

International Search Report and Written Opinion dated May 13, 2015, received in International Patent Application No. PCT/US2015/017724, which corresponds to U.S. Appl. No. 14/244,734, 12 pages, (Dean).

International Search Report and Written Opinion dated Jul. 25, 2014, received in International Patent Application No. PCT/US2014/029453, which corresponds to U.S. Appl. No. 13/963,444, 9 pages (Frayer).

International Search Report and Written Opinion dated Mar. 7, 2014, received in International Patent Application No. PCT/US2013/074772, which corresponds to U.S. Appl. No. 13/831,218, 10 pages (George).

International Search Report and Written Opinion dated Mar. 24, 2014, received in International Patent Application No. PCT/US2013/074777, which corresponds to U.S. Appl. No. 13/831,308, 10 pages (George).

International Search Report and Written Opinion dated Mar. 7, 2014, received in International Patent Application No. PCT/US2013/074779, which corresponds to U.S. Appl. No. 13/831,374, 8 pages (George).

Barr, Introduction to Watchdog Timers, Oct. 2001, 3 pgs.

Canim, Buffered Bloom ilters on Solid State Storage, ADMS10, Singapore, Sep. 13-17, 2010, 8 pgs.

Kang, A Multi-Channel Architecture for High-Performance NAND Flash-Based Storage System, J. Syst. Archit., 53, 9, Sep. 2007, 15 pgs.

Kim, A Space-Efficient Flash Translation Layer for CompactFlash Systems, May 2002, 10 pgs.

Lu, A Forest-structured Bloom Filter with Flash Memory, MSST 2011, Denver, CO, May 23-27, 2011, article, 6 pgs.

Lu, A Forest-structured Bloom Filter with Flash Memory, MSST 2011, Denver, CO, May 23-27, 2011, presentation slides, 25 pgs.

McLean, Information Technology—AT Attachment with Packet Interface Extension, Aug. 19, 1998, 339 pgs.

Park, A High Performance Controller for NAND Flash-Based Solid State Disk (NSSD), Feb. 12-16, 2006, 4 pgs.

Pliant Technology, International Search Report / Written Opinion, PCT/US08/88133, Mar. 19, 2009, 7 pgs.

Pliant Technology, International Search Report / Written Opinion, PCT/US08/88136, Mar. 19, 2009, 7 pgs.

Pliant Technology, International Search Report / Written Opinion, PCT/US08/88146, Feb. 26, 2009, 10 pgs.

Pliant Technology, International Search Report / Written Opinion, PCT/US08/88154, Feb. 27, 2009, 8 pgs.

Pliant Technology, International Search Report / Written Opinion, PCT/US08/88164, Feb. 13, 2009, 6 pgs.

Pliant Technology, International Search Report / Written Opinion, PCT/US08/88206, Feb. 18, 2009, 8 pgs.

Pliant Technology, International Search Report / Written Opinion, PCT/US08/88217, Feb. 19, 2009, 7 pgs.

Pliant Technology, International Search Report / Written Opinion, PCT/US08/88229, Feb. 13, 2009, 7 pgs.

Pliant Technology, International Search Report / Written Opinion, PCT/US08/88232, Feb. 19, 2009, 8 pgs.

Pliant Technology, International Search Report / Written Opinion, PCT/US08/88236, Feb. 19, 2009, 7 pgs.

Pliant Technology, International Search Report / Written Opinion, PCT/US2011/028637, Oct. 27, 2011, 11 pgs.

Pliant Technology, Supplementary ESR, 08866997.3, Feb. 23, 2012, 6 pgs.

(56) References Cited

OTHER PUBLICATIONS

SanDisk Enterprise IP LLC, International Search Report / Written Opinion, PCT/US2012/042764, Aug. 31, 2012, 12 pgs.
SanDisk Enterprise IP LLC, International Search Report / Written Opinion, PCT/US2012/042771, Mar. 4, 2013, 14 pgs.
SanDisk Enterprise IP LLC, International Search Report / Written Opinion, PCT/US2012/042775, Sep. 26, 2012, 8 pgs.
SanDisk Enterprise IP LLC, International Search Report / Written Opinion, PCT/US2012/059447, Jun. 6, 2013, 12 pgs.
SanDisk Enterprise IP LLC, International Search Report / Written Opinion, PCT/US2012/059453, Jun. 6, 2013, 12 pgs.
Sandisk Enterprise IP LLC, International Search Report / Written Opinion, PCT/US2012/059459, Feb. 14, 2013, 9 pgs.
SanDisk Enterprise IP LLC, International Search Report / Written Opinion, PCT/US2012/065914, May 23, 2013, 7 pgs.
SanDisk Enterprise IP LLC, International Search Report / Written Opinion, PCT/US2012/065916, Apr. 5, 2013, 7 pgs.
SanDisk Enterprise IP LLC, International Search Report / Written Opinion, PCT/US2012/065919, Jun. 17, 2013, 8 pgs.
SanDisk Enterprise IP LLC, Notification of the Decision to Grant a Patent Right for Patent for Invention, CN 200880127623.8, Jul. 4, 2013, 1 pg.
SanDisk Enterprise IP LLC, Office Action, CN 200880127623.8, Apr. 18, 2012, 12 pgs.
SanDisk Enterprise IP LLC, Office Action, CN 200880127623.8, Dec. 31, 2012, 9 pgs.
SanDisk Enterprise IP LLC, Office Action, JP 2010-540863, Jul. 24, 2012, 3 pgs.
Watchdog Timer and Power Savin Modes, Microchip Technology Inc., 2005, 14 pgs.
Zeidman, 1999 Verilog Designer's Library, 9 pgs.
International Search Report and Written Opinion dated May 18, 2015, received in International Patent Application No. PCT/US2015/016656, which corresponds to U.S. Appl. No. 14/275,690, 14 pages (Wright).
International Search Report and Written Opinion dated May 28, 2015, received in International Patent Application No. PCT/US2015/017729, which corresponds to U.S. Appl. No. 14/244,745, 14 pages (Ellis).

\* cited by examiner

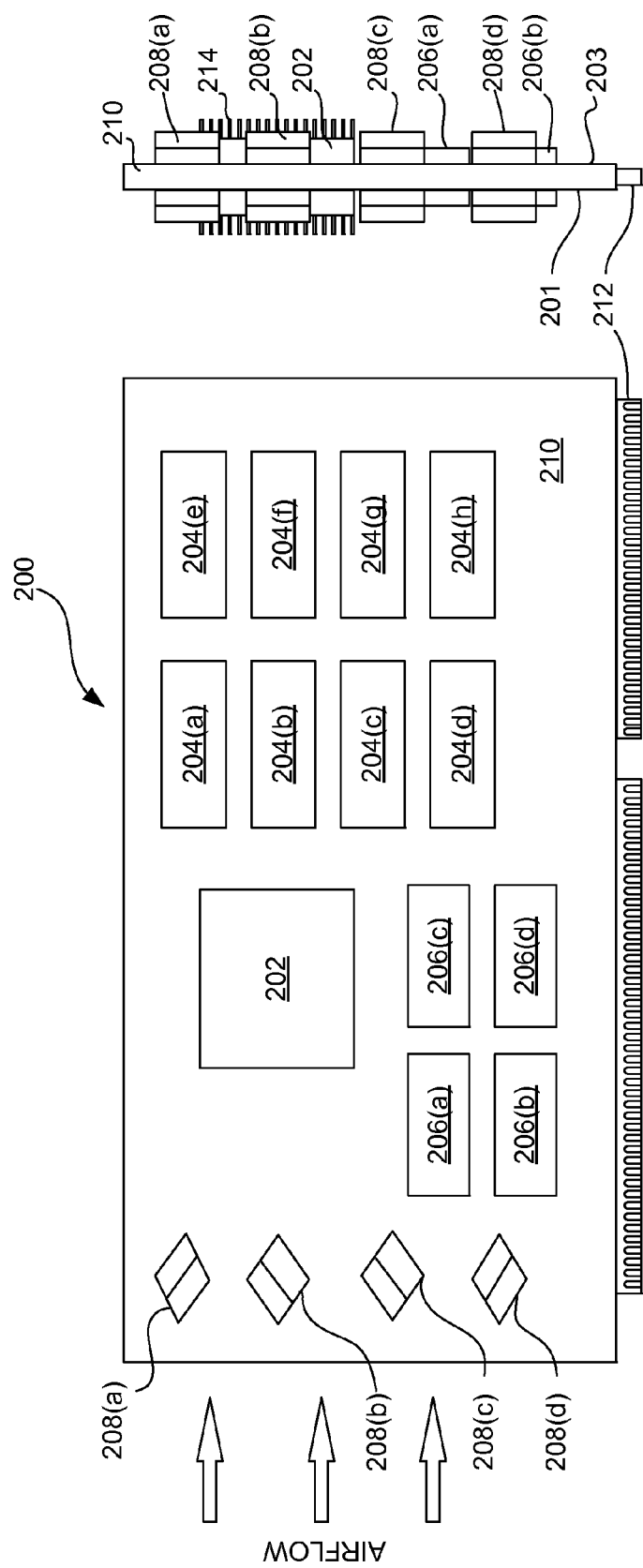

SYSTEM AND METHOD FOR REDIRECTING AIRFLOW ACROSS AN ELECTRONIC ASSEMBLY

TECHNICAL FIELD

This disclosure relates generally to cooling systems for electronic devices, and more specifically, to a system and method for redirecting an airflow across an electronic assembly having electronic devices.

BACKGROUND

Electronics, such as processors or memory, generate heat during operation. If left unchecked, this heat can reduce system performance and even lead to partial or complete system failure. As such, many existing technologies attempt to remove or dissipate heat through the use of heat sinks, cooling fans, etc.

While these technologies may be effective for cooling a single electronic component that is not located near other sources of heat, these technologies fall short when it comes to more complex systems that include multiple heat generation sources, such as server racks or storage arrays. Some storage arrays, like those that include multiple solid state drives (SSD), generate a significant amount of heat during operation.

Existing cooling systems for such systems typically include multiple high-speed fans. These high-speed fans are noisy; add significant expense to the system; increase the overall energy consumption of these systems; and decrease system efficiency. Moreover, existing cooling systems do not always alleviate localized hot-spots that form within the systems, which in turn shortens the life of the individual components within the system.

In light of these and other issues, it would be desirable to provide a system and method for more effectively cooling electronic components, especially those found in larger systems that contain multiple heat generating components.

SUMMARY

According to some embodiments, there is provided a system for redirecting airflow across one or more electronic assemblies. Each electronic assembly includes a substrate (e.g., a printed circuit board) having a substantially flat first surface and an opposing substantially flat second surface, at least one electronic device, and at least one first tab coupled to the electronic assembly. The at least one first tab is configured to redirect the airflow over the at least one electronic device. The tab may take on any suitable shape, such as an L-shape, T-shape, or I-shape, and may have a fixed angle or an adjustable angle relative to the substrate and airflow.

According to some embodiments, the electronic assembly also includes at least one second tab coupled to the second surface, where the at least one second tab is configured to redirect the airflow over the electronic assembly. In some embodiments, the tabs are coupled to a surface of the substrate by being soldered or glued to the substrate. In other embodiments, the tabs are coupled to the surface of the electronic devices.

The tabs redirect the airflow, sometimes creating turbulence and vortices, to better distribute the cooler airflow across the electronic devices and to better redirect the warmed airflow away from the electronic devices. These systems and methods more effectively cool the electronic devices, thereby minimizing localized hot-spots that form within such systems. These systems are quieter, less costly to run and maintain, and are more efficient.

The details of one or more implementations of the subject matter described in this specification are set forth in the accompanying drawings and the description below. Other features, aspects, and advantages of the subject matter will become apparent from the description, the drawings, and the claims.

BRIEF DESCRIPTION OF THE DRAWINGS

FIGS. 2A and 2B are side and front views, respectively, of an electronic assembly in accordance with some embodiments of the invention.

Like reference numerals refer to corresponding parts throughout the drawings.

DESCRIPTION OF IMPLEMENTATIONS

Figure 1:
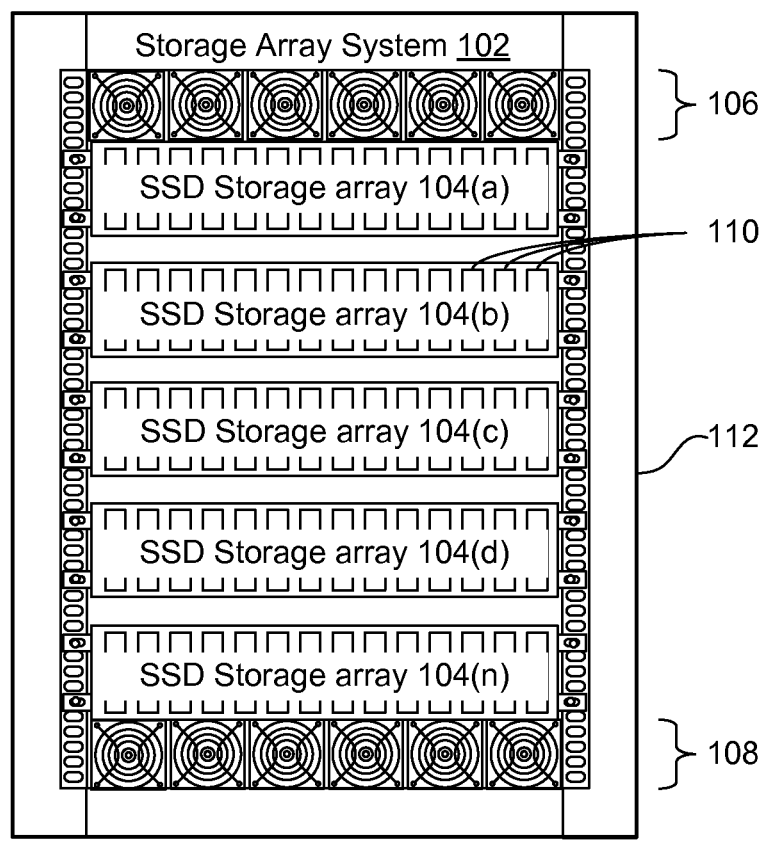
FIG. 1 is a schematic diagram of a storage array system in accordance with some embodiments of the invention.

As mentioned above, it is difficult to efficiently and effectively cool all of the electronic components in a large and complex electronic device, such as a server rack or storage array. FIG. 1 shows one such system—a solid state drive storage array system 102. The solid state drive (SSD) storage system 102 includes a cabinet 112 that contains multiple (e.g., rows or columns) of SSD storage arrays 104(a)-104(n). Each of these arrays 104 in turn contains multiple solid state drives 110, shown arranged parallel to one another in each array 104. Each solid state drive 110 includes a substrate (such as a printed circuit board), multiple solid state memory devices, a controller, and other circuitry.

In some embodiments, the storage array system 102 includes one or more fans 108, 106 installed in or otherwise fluidly coupled to the cabinet 112. In some embodiments, some fans, e.g., fans 108 draw cooler air into the cabinet 112 and force air past the solid state drives 110. In some embodiments, some fans (e.g., fans 106) exhaust heated air from the cabinet 112.

While FIG. 1 shows a storage array system 102, it should be appreciated by one skilled in the art that the embodiments described herein can be used with any system that requires cooling of multiple electronic components, such as desktop computers, servers, or the like, and works particularly well when an airflow (naturally occurring or forced air) passes over an electronic assembly having multiple heat generating components.

FIG. 2A is a side view of an electronic assembly 200 in accordance with some embodiments of the invention. FIG. 2B shows a side view of the electronic assembly 200. In some embodiments, the electronic assembly represents one of the solid state drives 110 of FIG. 1. The electronic assembly 200 is configured to be placed in an airflow (represented by the open arrows), such that air flows across the electronic assembly.

The electronic assembly 200 includes a substrate 210, such as a printed circuit board, that has a substantially flat first surface 201 and an opposing substantially flat second surface 203. The electronic assembly 200 also includes at least one electronic device, such as memory devices 204(a)-(h), a controller 202, and other circuitry 206(1)-(d). In some embodiments, each of the first side 201 and the second side 203 each include multiple electronic devices. In some embodiments, the each of the first side 201 and the second side 203 each include the same electronic devices.

In some embodiments, the electronic devices are mounted onto the sides of the substrate 210, while in other embodiments, the electronic devices are integrated into the substrate 210 (e.g., between the opposing surfaces of the substrate). In some embodiments, one or more heat dissipation devices, such as the finned heat-sink(s) 214, are thermally coupled to one or more of the electronic devices.

In some embodiments, the electronic assembly 200 includes a connector, such as the edge-card connector 212, for electrically (and/or mechanically) coupling the electronic assembly to a larger system.

The electronic assembly 200 also includes one or more tabs 208(a)-208(d). In the embodiment shown in FIGS. 2A and 2B, the tabs 208(a)-208(d) are positioned in a column at the leading edge of the substrate 210, i.e., at the side of the substrate that is first exposed to the incoming airflow. It should be appreciated, however, that these tabs may be placed at any convenient location, as described below.

In some embodiments, these tabs are mounted directly onto the first and/or second surfaces 201, 203 of the substrate 210. In some embodiments, the tabs are glued to the electronic assembly 200, while in other embodiments the tabs are soldered to the electronic assembly 200. In some embodiments, a base of the tab is "tinned" to facilitate soldering to a specially positioned tab-receiving pad on the substrate 210. Other mechanisms for mounting the tabs are shown and described below in relating to FIGS. 4 and 5.

In some embodiments, the tabs 208(a)-208(d) are integrally formed with the substrate, i.e., the substrate and the tabs are formed as a single component. For example, the substrate and the tabs may be injection molded as a single component.

In some embodiments, the tabs 208(a)-208(d) are constructed from a metal material, while in other embodiments they are constructed from an ESD (Electro Static Discharge) plastic. ESD plastic is used because airflow over the tabs may generate static electricity, which, in turn, may damage electronic components on the substrate if not properly discharged. In some embodiments, the tabs are grounded to earth. In some embodiments, the tabs (e.g., metal tabs) transfer heat away from the substrate 210. In some embodiments, the tabs are thermally coupled to the heat generating devices, e.g., via traces, vias, thermal paste, a thermal layer in or on the substrate, or the like.

As described in more detail below, each tab 208(a)-208(d) is positioned at an angle to the airflow, thereby redirecting the airflow across the electronic assembly. In some embodiments, the tabs mix the airflow to generate a turbulent airflow across the PCB. In some embodiments, the tabs mix the airflow to generate vortexes in the airflow. The airflow generated by the tabs provides an even airflow across the electronic assembly, thereby avoiding the creation of localized hotspots.

In some embodiments, the orientation of each tab is determined at pick-and-place time when the tab is being couple to the electronic assembly 200. The angle of each vortex tab on a PCB is chosen to change the airflow at different areas of the electronic assembly 200. For example, a tab may be oriented to redirect airflow across a component, or tabs may be oriented to redirect airflow into each other to generate turbulence.

In some embodiments, a system, such as the storage array system of FIG. 1, includes at least two electronic assemblies disposed adjacent to one another such that airflow can pass between the electronic assemblies. In this configuration, the tabs of the two electronic assemblies may also redirect the airflow from one electronic assembly to the adjacent electronic assembly, thereby further increasing turbulence and increasing cooling of the components on both assemblies.

Figure 2C:
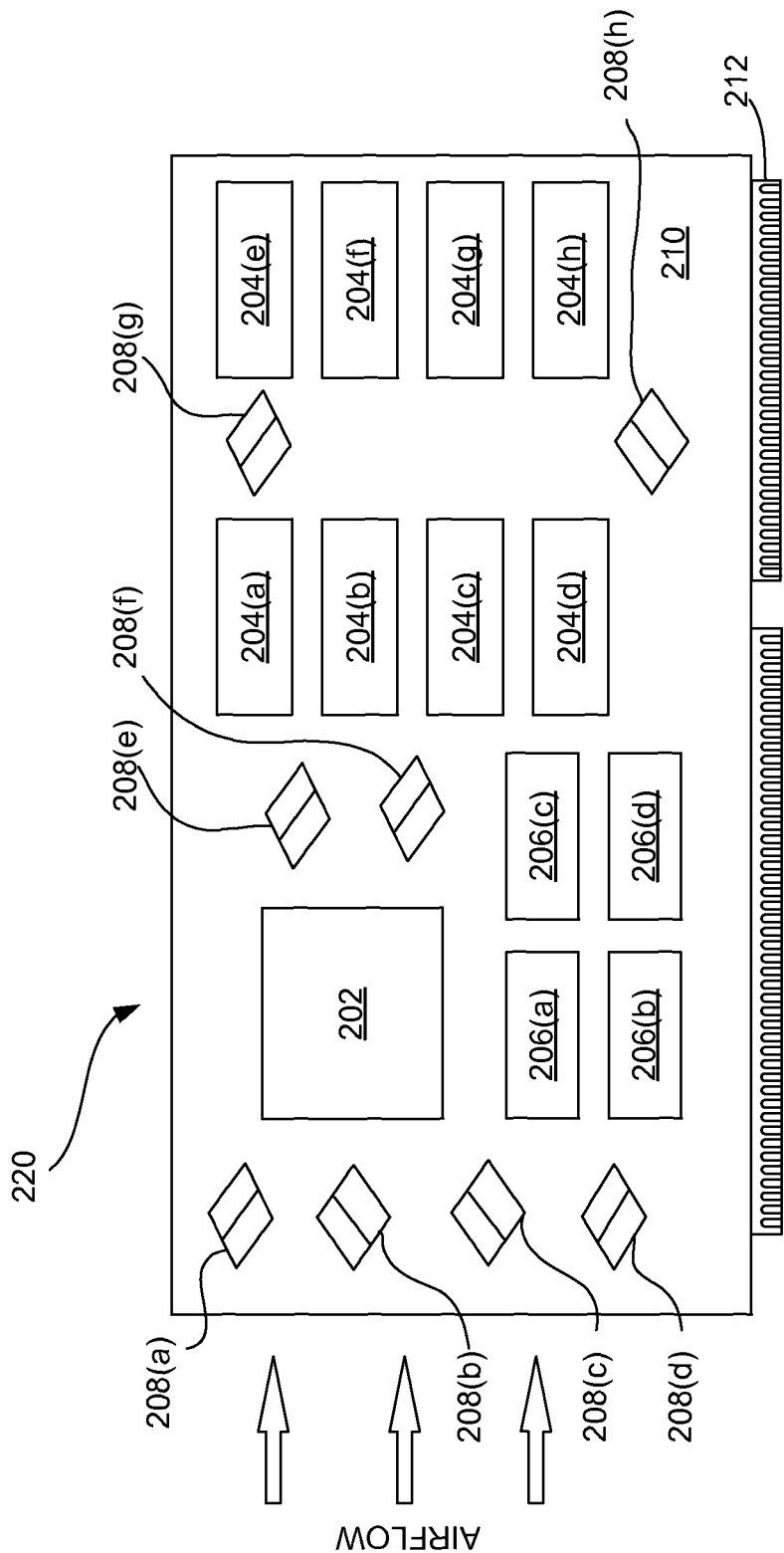
FIG. 2C is a side view of a different electronic assembly in accordance with another embodiment of the invention.

FIG. 2C is a side view of a different electronic assembly 220 in accordance with another embodiment of the invention. In this embodiment, additional tabs 208(e)-208(h) are placed at other locations on the electronic assembly 200. The locations of the tabs in any of the FIGS. 2A-C embodiments are selected based on the location of the heat generating components; the cooling requirements of the electronic assembly; the existing airflow (be it natural or forced-air); the available space on the substrate 210; the size and type of tab; the surrounding electronic assemblies; etc. The angle of the tabs relative to the airflow (angle of attack) are used to control or vector the air in different directions across the electronic assembly.

While the tabs 208(a)-208(h) may have any suitable shape and size to address the airflow speed and other specifications of the electronic assembly, the description that follows describes a subset of suitable tab configurations. In some implementations, the tabs are 2 to 8 mm tall×4 to 8 mm length×2 to 6 mm wide, or any other configuration that does not exceed the application's Form Factor Limits set forth and documented by an industry committee.

Figure 3A:
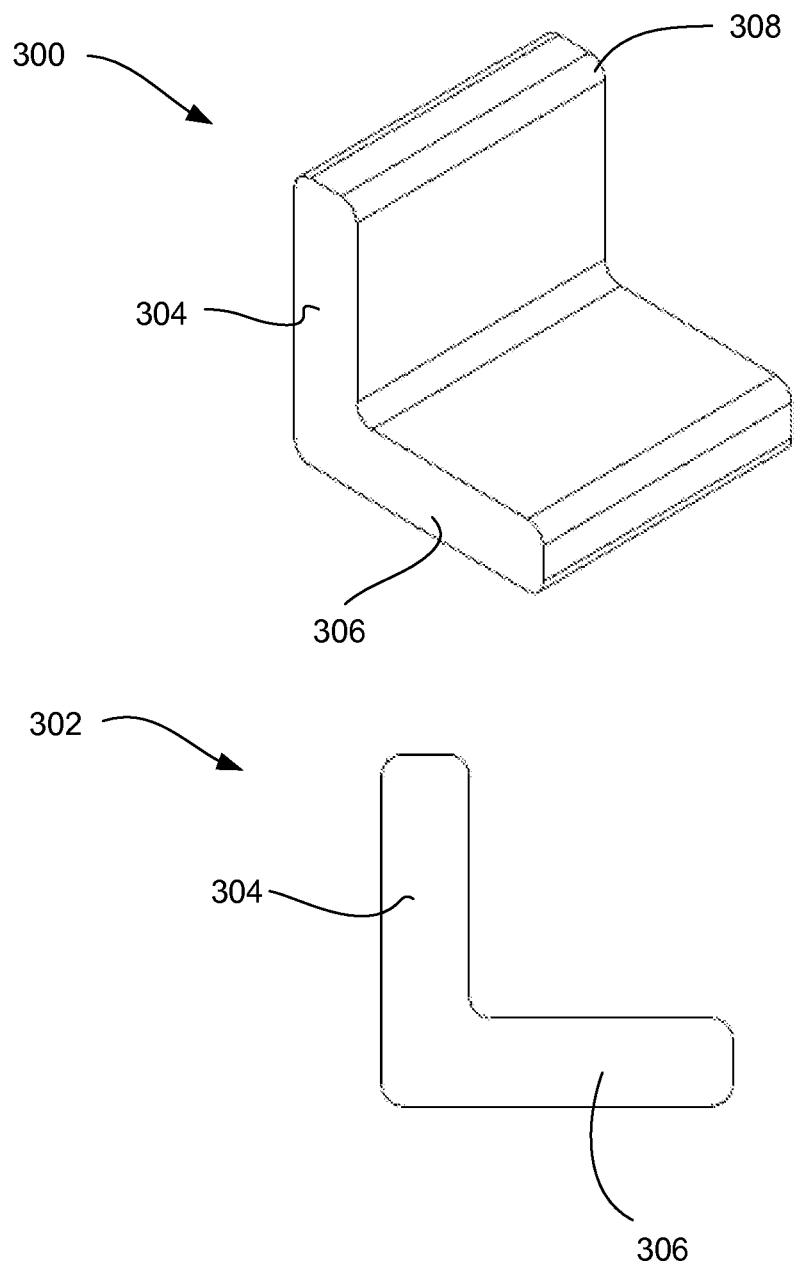
FIGS. 3A-3D show various views of various different tabs used in various different embodiments of the invention.

FIG. 3A shows an oblique view 300, and a side view 302, of an L-shaped tab. The L-shaped tab has a base 306 connected to a projection 304. In some embodiments, the projection 304 is orthogonal to the base 306. In some embodiments, the base is configured to couple to the substrate 210 (FIGS. 2A-C) as described above. The projection 304 is configured to be placed in the airflow to redirect the airflow. In some embodiments, the edges (e.g., edge 308) of the L-shaped tab are chamfered.

Figure 3B:
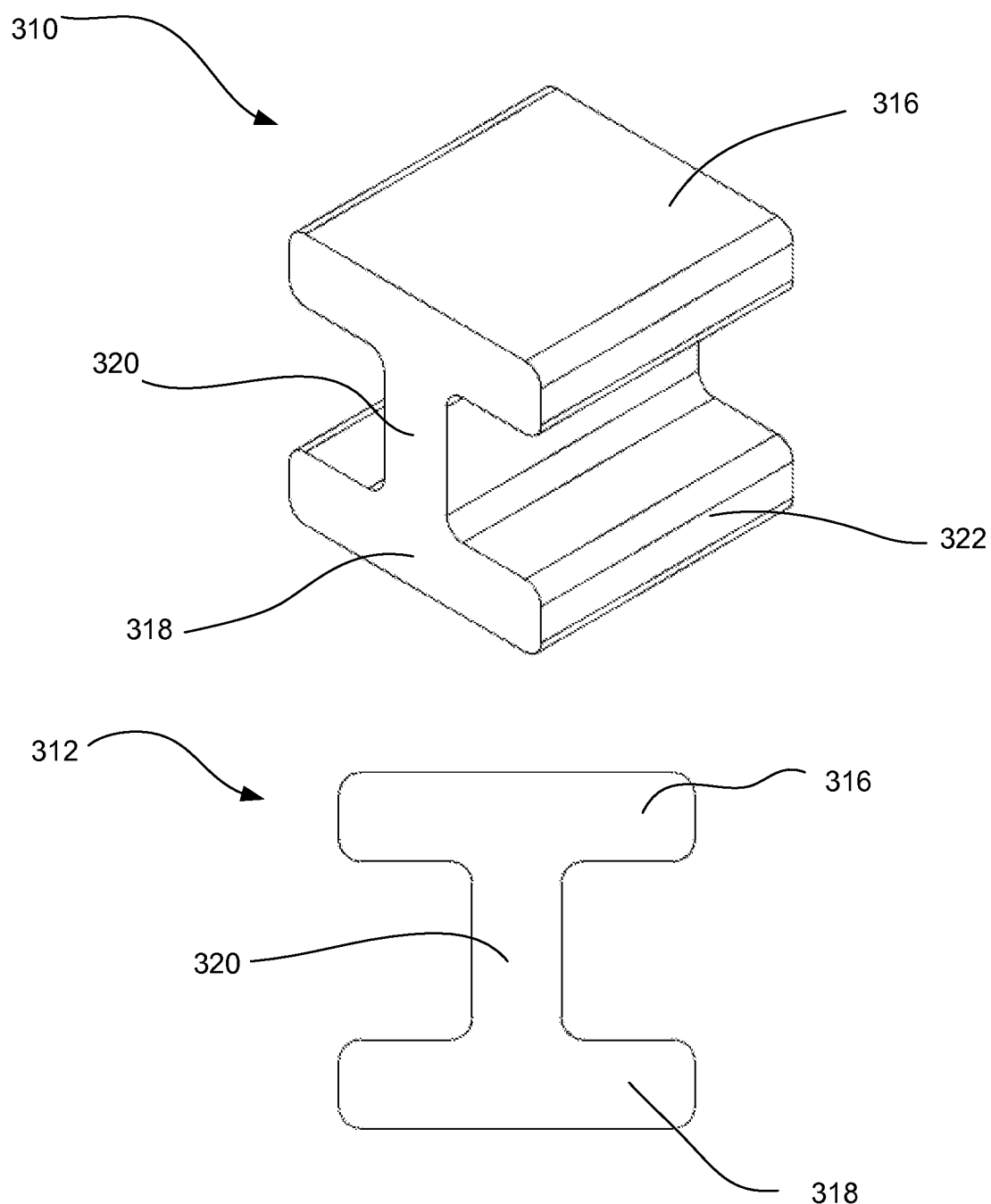

FIG. 3B shows an oblique view 310, and a side view 312, of an I-shaped tab. The I-shaped tab has a base flange 318 connected to a web 320, which in turn connects to a capital flange 316. In some embodiments, the web 320 is orthogonal to the flanges 318, 316. In some embodiments, the base flange is configured to couple to the substrate 210 (FIGS. 2A-C) as described above. The web 320 and capital flange 316 is configured to redirect the airflow. In some embodiments, the edges (e.g., edge 322) of the I-shaped tab are chamfered.

Figure 3C:
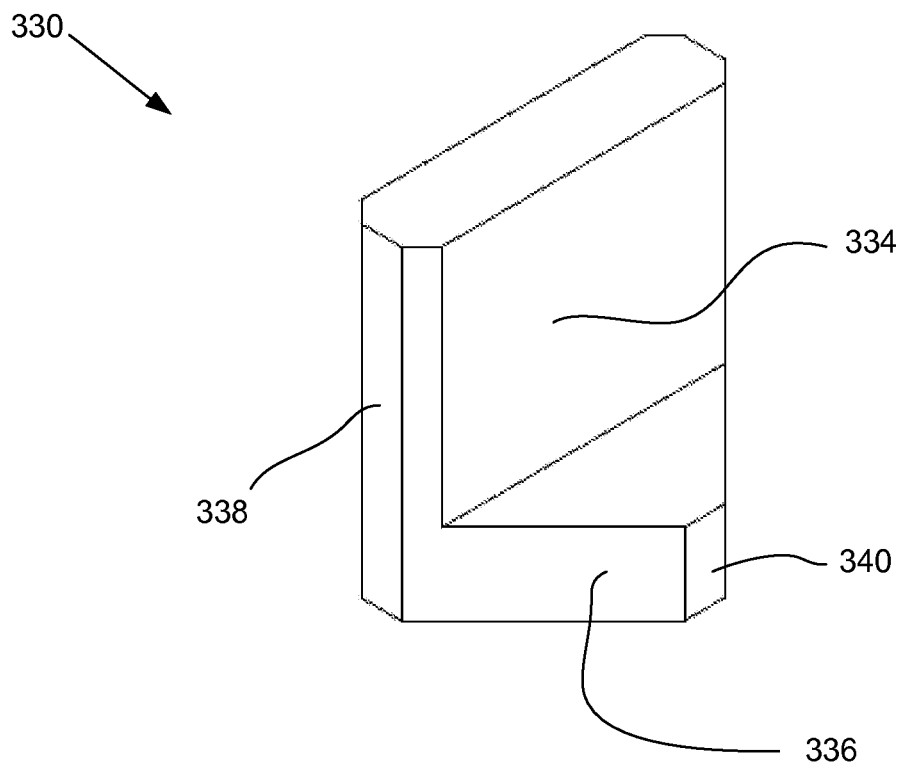
Figure 3C:
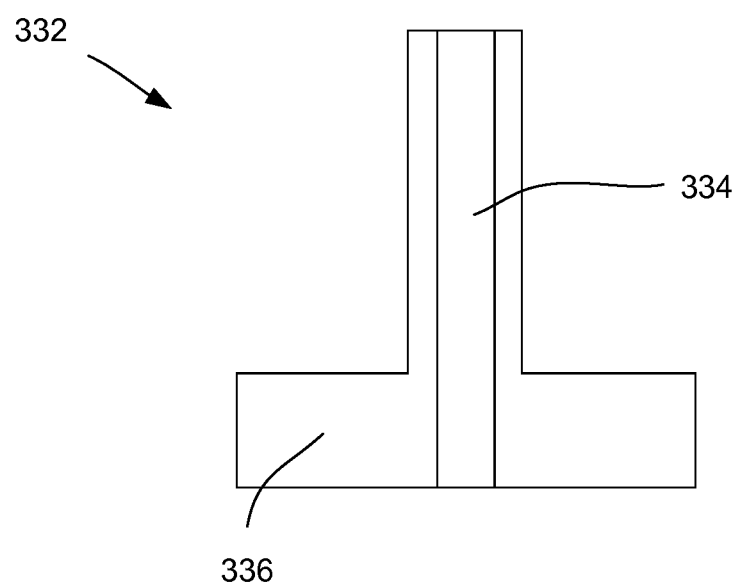

FIG. 3C shows an oblique view 330, and a side view 332, of a modified L-shaped tab. The modified L-shaped tab has a base 336 connected to a projection 334. In some embodiments, the projection 334 is orthogonal to the base 336. In some embodiments, the base is configured to couple to the substrate 210 (FIGS. 2A-C) as described above. The projection 334 is configured to be placed in the airflow to redirect the airflow. In some embodiments, the edges (e.g., edge 338) of the modified L-shaped tab are chamfered. In some embodiment, the base 336 has a reduced footprint to reduce the mounting surface area on the substrate and, where soldered to the substrate, to reduce the amount of solder required to mount the tab to the substrate. In some embodiments, the base has a triangular area, and in some embodiments the vertices of the triangular area are truncated to further reduce the footprint.

Figure 3D:
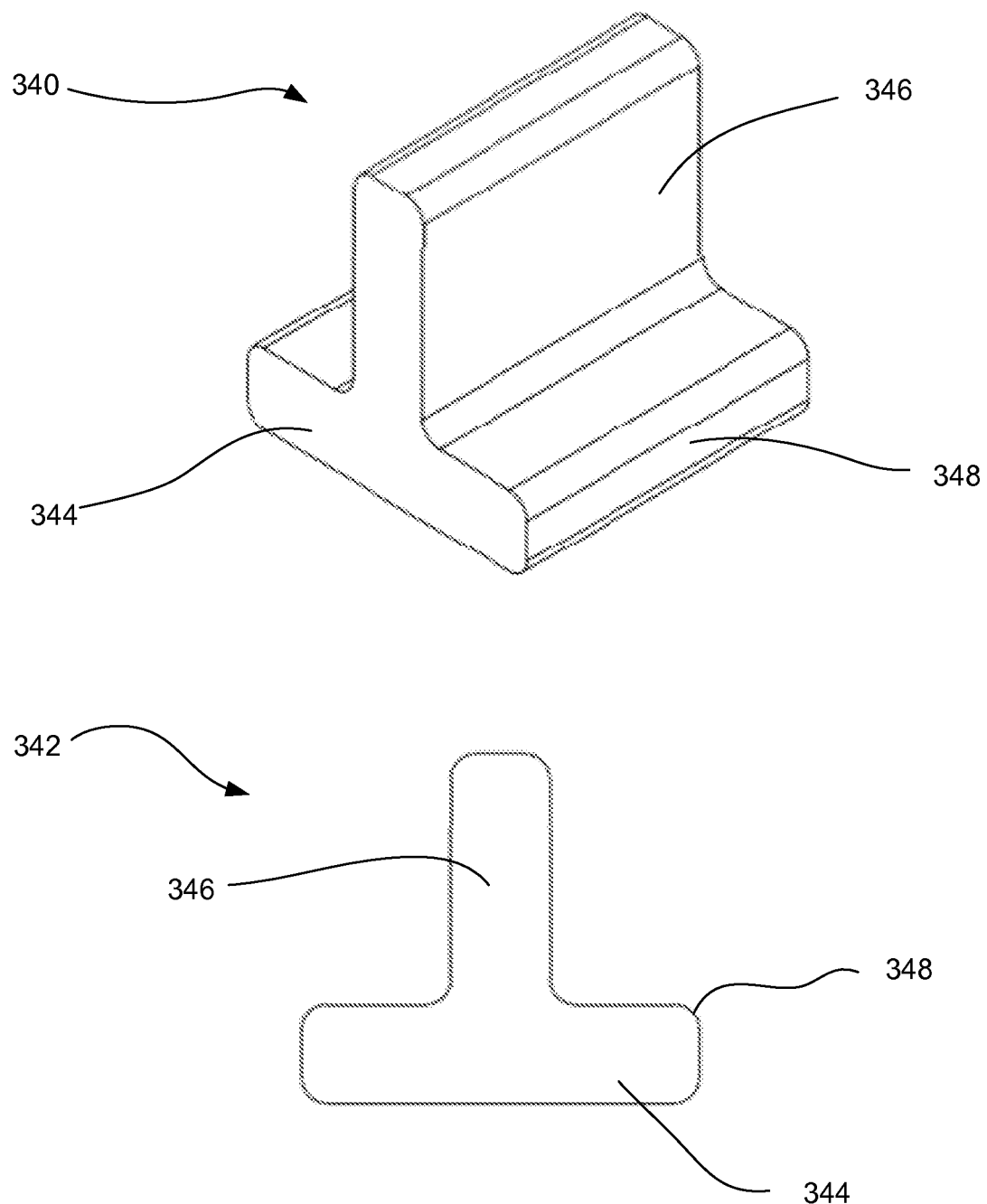

FIG. 3D shows an oblique view 340, and a side view 342, of an inverted T-shaped tab. The T-shaped tab has a base 344 connected to a projection 346. In some embodiments, the projection 346 is orthogonal to the base 344. In some embodiments, the base 344 is configured to couple to the substrate 210 (FIGS. 2A-C) as described above. The projection 344 is configured to redirect the airflow. In some embodiments, the edges (e.g., edge 348) of the I-shaped tab are chamfered.

Any of the tabs described above in relation to FIGS. 3A-D may be extruded or injection molded, and may require additional machining Insome embodiments, the height of the tab that extends into the airflow is significantly higher that the surrounding components.

Figure 4A:
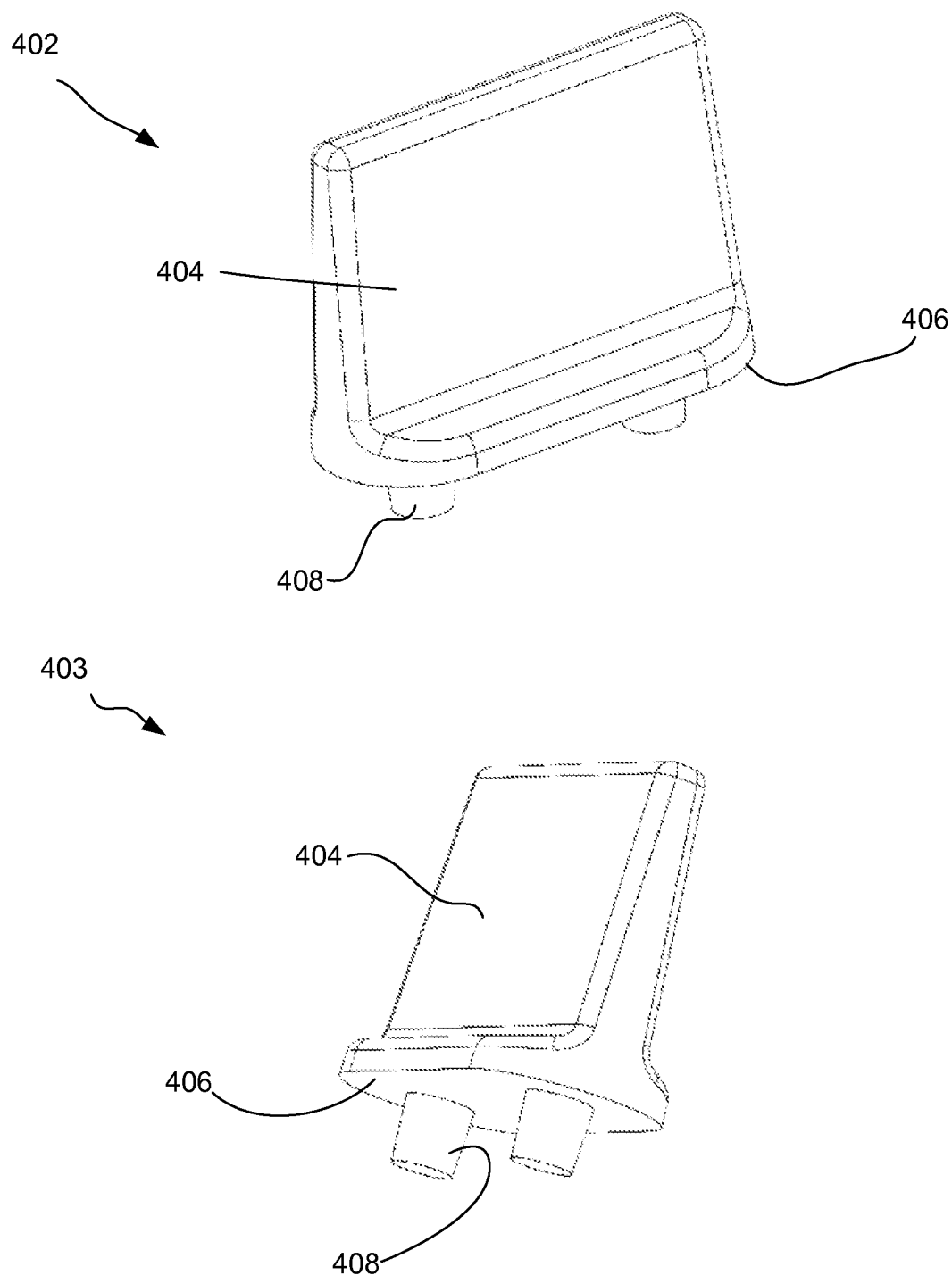
FIG. 4A shows various views of another tab used in an embodiment of the invention.

FIG. 4A shows a first oblique view 402, and a second oblique view 403 of another tab used in an embodiment of the invention. This tab has a similar shape to the inverted T-shaped tab of FIG. 3D, but has rounded edges on the base 406; rounded and tapered sides on the projection 404; and through-hole pegs 408 that are slightly tapered as they extend away from the base 406. In some embodiments, this tab has an airfoil shape. The through-hole pegs 408 are configured to be inserted into corresponding holes on the electronic assembly 200 or 220 (e.g., through-holes formed in the substrate 210).

Figure 4B:
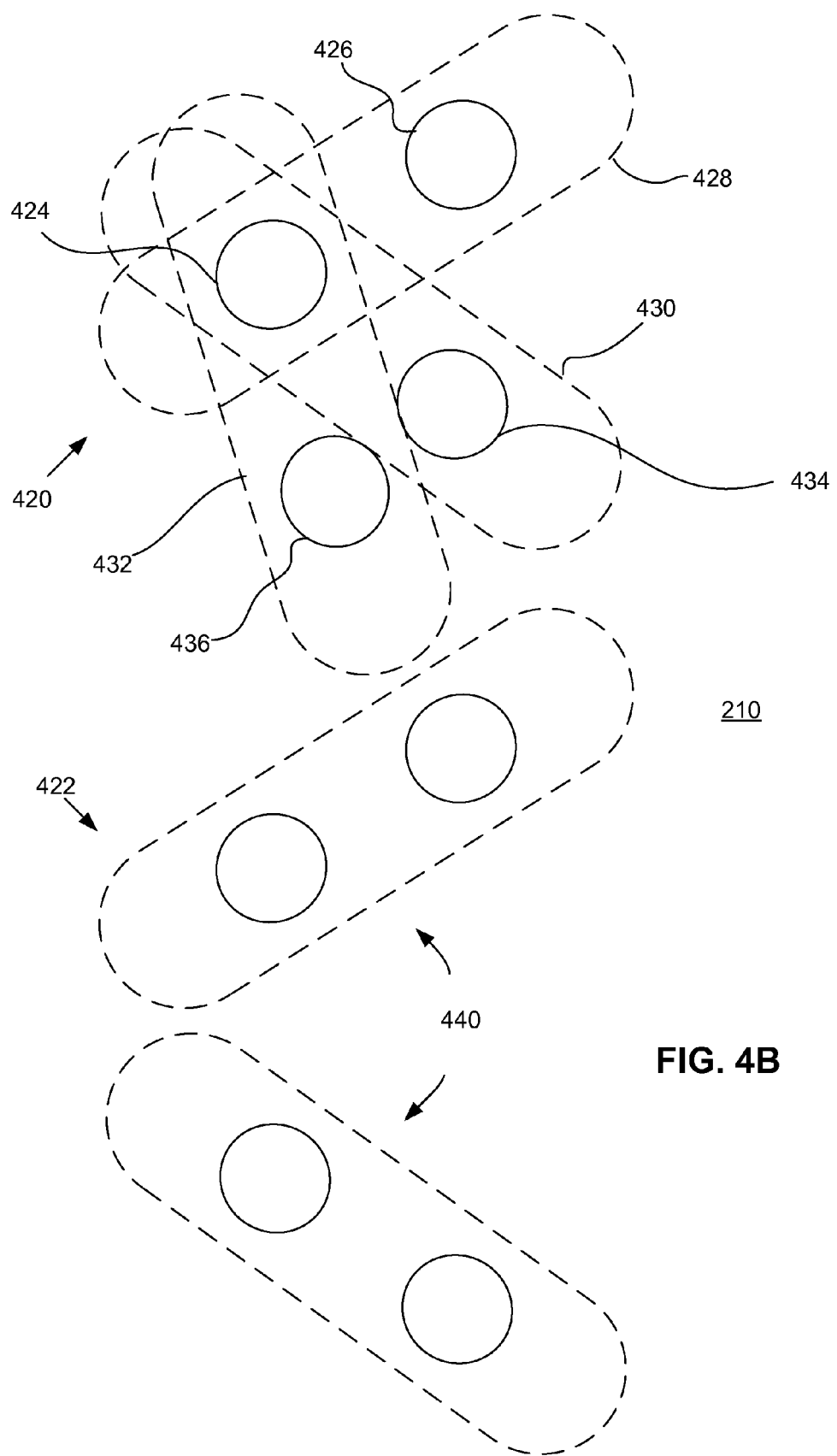
FIG. 4B is a top view of a portion of the electronic assembly of FIGS. 2A-2C when used in combination with the tab shown in FIG. 4A.

FIG. 4B is a top view of a portion of the electronic assembly 200 or 220 of FIGS. 2A-2C when used in combination with the tab shown in FIG. 4A. In some embodiments, FIG. 4B is a top view of the substrate 210 of the electronic assembly 200 or 220 of FIGS. 2A-2C. The upper portion of the figure shows a first embodiment 420 where the substrate 210 includes a leading hole 424 and a number of trailing holes 426, 434, 436 formed therein. In some embodiments, these holes 424, 426, 434, 436 are formed at least partially through the substrate 210, while in other embodiments, the holes are formed completely through the substrate from the first side 201 (FIG. 2A) to the second side 203 (FIG. 2A). In the airflow, the leading hole 424 is located upwind (closer to the leading edge of the tab) of the trailing holes 426, 434, 436 (which are located downwind of the leading hole 424 closer to the trailing edge of the tab).

In use, one of the pegs 408 of the tab of FIG. 4A is positioned in the leading hole 424, while the other one of the pegs 408 is positioned in one of the trailing holes 426, 434, 436. In this way, the angle of attack to the airflow of the tab can be adjusted as necessary. The dashed lines 428, 430, and 432 show the outline of the base 406 of the tab of FIG. 4A when positioned in one of three positions on the substrate 210.

The lower portion of FIG. 4B shows a second embodiment 422 where the substrate 210 includes two sets of holes 440 each containing its own leading hole and trailing hole, i.e., the leading hole is not reused as was the case with the first embodiment 424. In use, the tab is positioned in either one of the sets of holes 440.

The tabs may be secured in place by gluing the bases or pegs into position, by soldering, or my any other appropriate means. Moreover, any number of holes may be placed in the electronic assembly (or substrate) to position each tab at a desired angle of attack. The desired angle of attack is selected based on the desired characteristics of the airflow, such as direction, speed, turbulence, stall, etc.

Figure 4C:
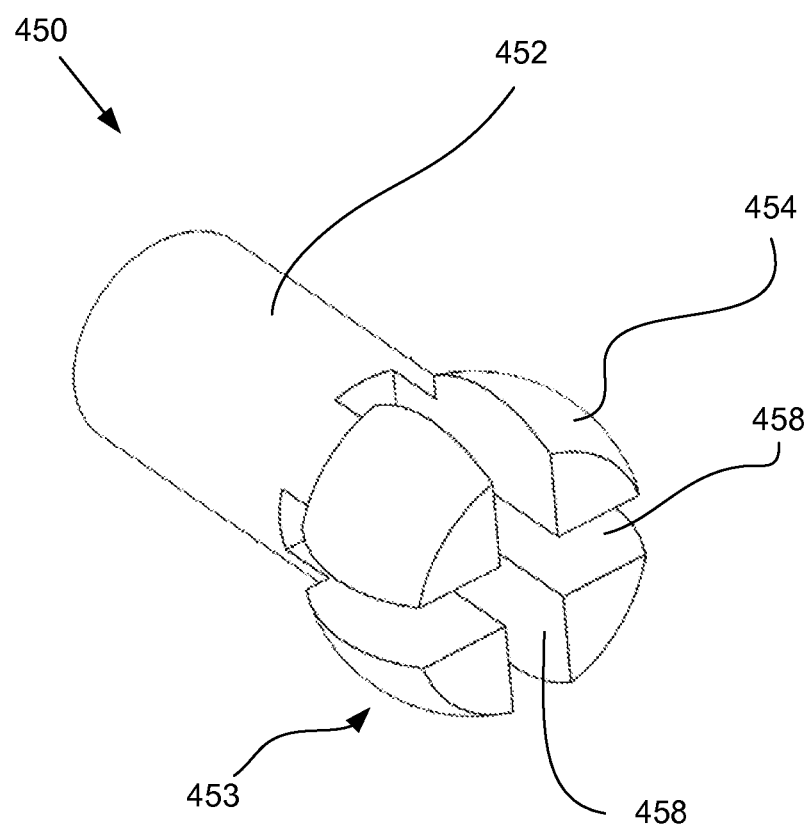
FIG. 4C is a perspective view of a push pin that may be used with the embodiments shown in FIGS. 4A-4B or FIGS. 5A-5D FIGS. 5A-5D show another tab used in other embodiments of the invention.

In some embodiments, the pegs 408 (FIG. 2A) are replaced with mounting or retention push pins 450, as shown in FIG. 4C. These pins 450 allow the tabs to secured onto the substrate 210 (FIGS. 2A-2C) simply by pushing the pin 450 through the holes formed through the substrate.

Each pin 450 includes a shaft 452 having a first diameter and a head 453 having a larger diameter than the shaft. The head 453 includes segments 454 separated by channels 458, and is made from an elastic or resilient material that allows the segments to be bent into the channels when being forced through a hole smaller than the head but larger than the shaft, but then be able to resiliently return to their normal biased position when exiting the other side of the hole. In use, the pins 450 of each tab are forced through the holes in the substrate to lock the tab to the substrate. In other embodiments, any other suitable retaining or locking pin may be used.

Figure 5A:
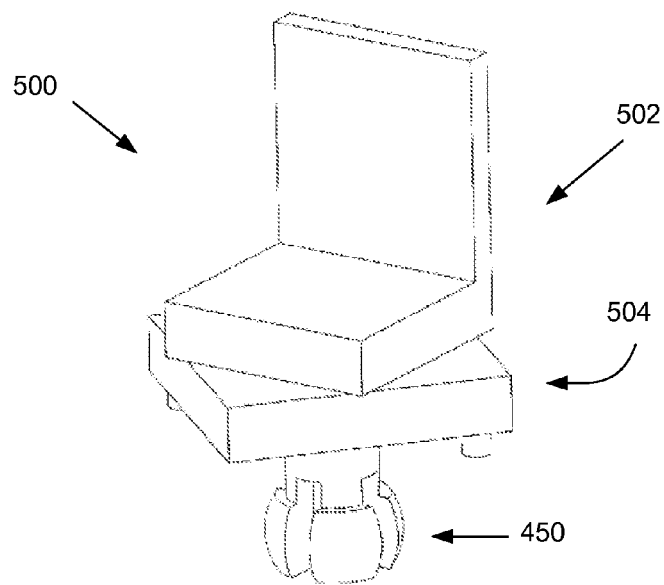
Figure 5B:
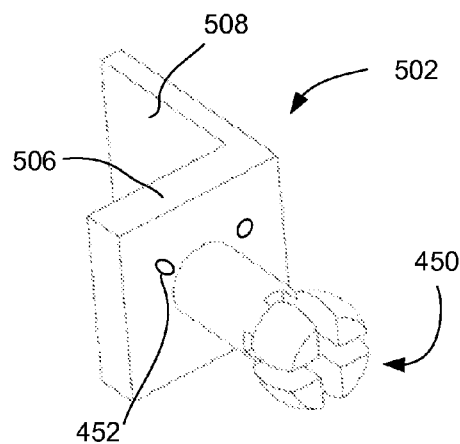
Figure 5C:
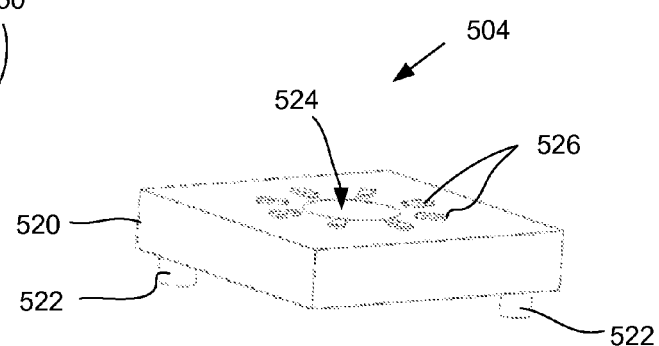
Figure 5D:
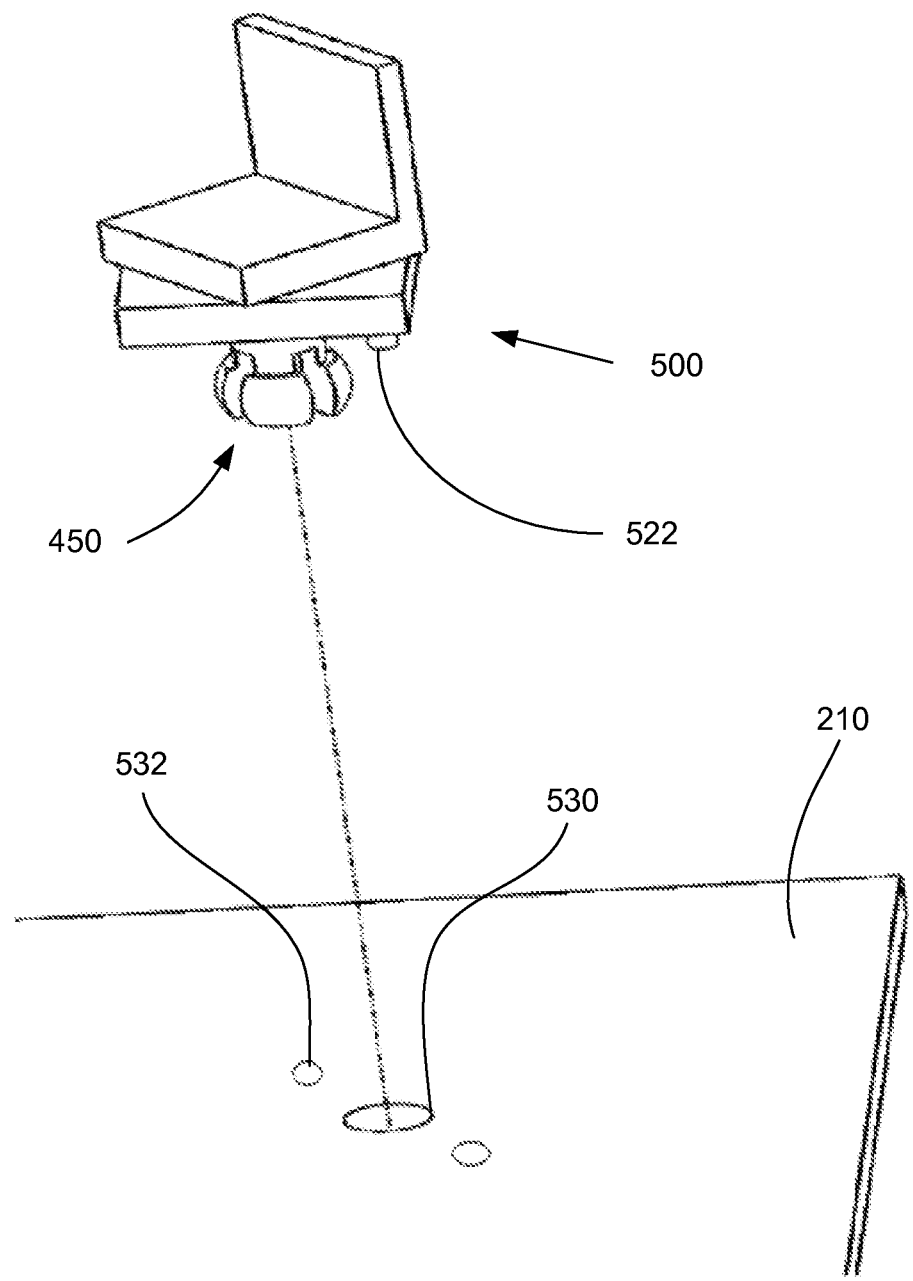

FIGS. 5A-5D show another tab 500 used in other embodiments of the invention. Once mounted on the electronic assembly, this tab 500 can be reoriented at any time by an installer or user. The tab 500 comprises two parts, namely a tab portion 502 and base portion 504. In some embodiments the tab 500 is constructed from a metal material, while in other embodiments it is constructed from an ESD plastic. Furthermore, in some embodiments the tab 500 is glued or soldered to the electronic assembly. In other embodiments, as shown in FIG. 5D, the tab 500 is mounted to the substrate 210 by pressing a push pin 450 (described in relation to FIG. 4C) of the base portion 504 through a hole 530 formed in the substrate 210. This affixes the tab 500 to the substrate 210.

Returning to FIGS. 5A-5C, the tab portion 502 includes a base 506 configured to be placed on the surface of the electronic assembly (e.g., substrate 210). A tab 508 extends substantially orthogonally from the base 506. The push pin 450 extends from the bottom of the base 450, as shown. The tab 508 is configured to be placed at an angle of attack into the airflow. The base 506 also includes a number of small protrusions (or detents) 452.

The base portion 504 includes a substantially flat base 520 with a hole 524 formed there through. The diameter of the hole 524 is slightly larger than the diameter of the push pin 450, such that the push pin 450 can be pushed through the hole 524 in the base 520 to secure the tab portion 502 to the base portion 504. The base 520 also includes a number of detents (or protrusions) 526 configured to mate with the small protrusions (or detents) 452 to prevent the tab portion 502 from being able to be rotated by the airflow, but still allowing a user to rotate the tab portion 502 relative to the base portion 504 to adjust the angle of attack of the tab 508. Alternatively, the protrusions 526 are merely friction bumps to help maintain the tab in the correct position in the airflow.

Finally, as shown in FIG. 5D, the base portion includes projections (or detents) 522 configured to mate with corresponding detents (or projections) 532 formed in the electronic assembly (e.g., substrate 210). These detents act as guide holes on either side of the main mounting hole to align the base portion and to stop the base portion from rotating relative to the electronic assembly (e.g., substrate 210) once coupled to one another. Angle marking can also be molded or printed on the base or substrate to indicate angle assignment for board level or cabinet level construction.

One of the main advantages of the adjustable tab 402, 403, 500 is the ability to assemble the circuit boards with the same part and be able to set the airflow angle (angle of attack) after assembly. It is also possible to adjust the angle of each tab based on the specific configuration of a system.

It should be understood that the particular order in which the operations have been described above is merely exemplary and is not intended to indicate that the described order is the only order in which the operations could be performed. One of ordinary skill in the art would recognize various ways to reorder the operations described herein.

The foregoing description, for purpose of explanation, has been described with reference to specific implementations. However, the illustrative discussions above are not intended to be exhaustive or to limit the invention to the precise forms disclosed. Many modifications and variations are possible in view of the above teachings. The implementations were chosen and described in order to best explain the principles of the invention and its practical applications, to thereby enable others skilled in the art to best utilize the invention and various implementations with various modifications as are suited to the particular use contemplated.

What is claimed is:

1. A system for redirecting airflow across an electronic assembly, comprising:
    an electronic assembly comprising:
        a substrate, wherein the substrate has a substantially flat first surface and an opposing substantially flat second surface;
        at least one electronic device coupled to the substrate; and
        at least one first tab and at least one second tab, wherein the at least one first tab is coupled to the flat first surface of the substrate of the electronic assembly, and the at least one second tab is coupled to the flat second surface of the substrate of the electronic assembly, such that when air flows over the electronic assembly, the at least one first tab redirects the air over the at least one electronic device.

2. The system of claim 1, wherein the first and second tabs are soldered to the substrate.

3. The system of claim 2, wherein the substrate is a printed circuit board.

4. The system of claim 1, wherein each of the first and second tabs include at least one projection, where each projection mates with a hole in the substrate.

5. The system of claim 4, wherein each projection is a push pin biased to lock into place once inserted through its respective hole in the substrate.

6. The system of claim 1, wherein the first and second tabs are oriented to cause turbulent airflow.

7. The system of claim 1, wherein multiple first tabs are affixed to the first surface at two or more different angles with respect to one another, and multiple second tabs are affixed to the second surface at two or more different angles with respect to one another.

8. The system of claim 1, wherein the at least one first tab is disposed substantially perpendicular to the first surface, and the at least one second tab is disposed substantially perpendicular to the second surface.

9. The system of claim 1, further comprising multiple electronic assemblies disposed adjacent and parallel to one another.

10. The system of claim 1, wherein the at least one electronic device comprises multiple integrated circuit memory devices.

11. The system of claim 1, wherein the at least one electronic device comprises multiple electronic devices coupled to each of the first surface and the second surface of the substrate.

12. The system of claim 1, wherein the at least one electronic device comprises multiple electronic devices disposed between the first surface and the second surface.

13. The system of claim 1, farther comprising a source of the airflow.

14. The system of claim 1, wherein the first tab is L-shaped, T-shaped, or I-shaped.

15. The system of claim 1, wherein an angle of the first tab is adjustable.

16. The system of claim 15, wherein the angle is adjusted by rotating the tab with respect to the substrate and inserting pins of the tab into corresponding holes formed in the substrate.

17. The system of claim 15, wherein the tab comprises a tab portion rotatably coupled to a base portion, where the base portion is affixed to the substrate and the angle of the tab portion is adjusted by rotating the tab portion relative to the base portion and the substrate.

18. A system for redirecting airflow across a substrate:
    a substrate having opposing first and second sides and comprising at least a first electronic device coupled to the first side and at least a second electronic device coupled to the second side; and
    multiple tabs affixed to the first and second sides of the substrate, wherein when the substrate receives an airflow, the multiple tabs redirects the airflow over the first and second electronic devices.

19. The system of claim 1, wherein the at least one first tab and the at least one second tab are positioned directly between a source of the airflow and the at least one electronic device to direct the airflow over the at least one electronic device.

20. The system of claim 19, wherein an angle of incidence of the at least one first tab with reference to the air.

21. The system of claim 20, wherein the angle is adjusted by rotating the at least one first tab with respect to the substrate and inserting a pin of the at least one first tab into a corresponding hole formed in the substrate.

22. The system of claim 20, wherein the at least one first tab comprises a tab portion rotatably coupled to a base portion, where the base portion is affixed to the substrate and the angle of the tab portion is adjusted by rotating the tab portion relative to the base portion and the substrate.

* * * * *

UNITED STATES PATENT AND TRADEMARK OFFICE
CERTIFICATE OF CORRECTION

PATENT NO. : 9,549,457 B2  Page 1 of 1
APPLICATION NO. : 14/179247
DATED : January 17, 2017
INVENTOR(S) : Ellis et al.

It is certified that error appears in the above-identified patent and that said Letters Patent is hereby corrected as shown below:

In the Claims

Claim 20, Column 8, Line 44, please delete "to the air." and insert --to the air is adjustable.--.

Signed and Sealed this
Twenty-eighth Day of March, 2017

Michelle K. Lee
*Director of the United States Patent and Trademark Office*